(12) United States Patent
Kleinschmidt

(10) Patent No.: US 11,871,537 B2
(45) Date of Patent: Jan. 9, 2024

(54) COOLING SYSTEM FOR A MATERIAL SURFACE TREATMENT SYSTEM

(71) Applicant: Illinois Tool Works Inc., Glenview, IL (US)

(72) Inventor: Robert Kleinschmidt, Hartford, WI (US)

(73) Assignee: Illinois Tool Works Inc., Glenview, IL (US)

( * ) Notice: Subject to any disclaimer, the term of this patent is extended or adjusted under 35 U.S.C. 154(b) by 486 days.

(21) Appl. No.: 16/778,737

(22) Filed: Jan. 31, 2020

(65) Prior Publication Data

US 2021/0243916 A1    Aug. 5, 2021

(51) Int. Cl.
| | |
|---|---|
| *B05B 5/00* | (2006.01) |
| *B41F 23/00* | (2006.01) |
| *H05K 7/20* | (2006.01) |
| *B05B 5/16* | (2006.01) |
| *B41F 23/04* | (2006.01) |
| *B05B 5/057* | (2006.01) |

(52) U.S. Cl.
CPC ......... *H05K 7/20272* (2013.01); *B05B 5/057* (2013.01); *B05B 5/1608* (2013.01); *B41F 23/0476* (2013.01)

(58) Field of Classification Search
None
See application file for complete search history.

(56) References Cited

U.S. PATENT DOCUMENTS

| | | | |
|---|---|---|---|
| 5,401,368 A | 3/1995 | Ford | |
| 5,437,844 A * | 8/1995 | Bonner | .................. C01B 13/11 |
| | | | 422/906 |
| 6,806,438 B2 * | 10/2004 | Nakano | .................... H01L 22/20 |
| | | | 257/E21.525 |
| 8,436,246 B1 | 5/2013 | Scofield | |
| 8,642,974 B2 * | 2/2014 | Kellogg | ................... H05H 1/46 |
| | | | 250/423 R |
| 11,279,633 B2 * | 3/2022 | Kang | ................. H01J 37/32055 |
| 2010/0006441 A1 * | 1/2010 | Renaud | ............. B01L 3/502746 |
| | | | 204/643 |
| 2018/0111442 A1 * | 4/2018 | Durkin | ................... B62D 25/12 |

FOREIGN PATENT DOCUMENTS

| | | |
|---|---|---|
| CN | 106032269 A | 10/2016 |
| CN | 110337171 | 10/2019 |
| WO | 2018001463 | 1/2018 |

OTHER PUBLICATIONS

Int'l Search Report and Written Opinion Appln No. PCT/US2021/015421 dated May 20, 2021.

* cited by examiner

*Primary Examiner* — Courtney L Smith
(74) *Attorney, Agent, or Firm* — McAndrews, Held & Malloy, Ltd.

(57) ABSTRACT

The present disclosure describes systems and methods to provide electrode cooling for material surface treatment systems. A cooling fluid is employed to cool electrodes with a high voltage applied. For example, a conduit conveys a cooling fluid through the electrode, as the conduit also provides electrification for the electrode by being connected to an electrical power source. Further, cooling is implemented by use of a voltage isolator disposed between the conduit and a reservoir, with the voltage isolator providing a pathway to a reference voltage for residual electric charge from the cooling fluid passing through the voltage isolator.

18 Claims, 4 Drawing Sheets

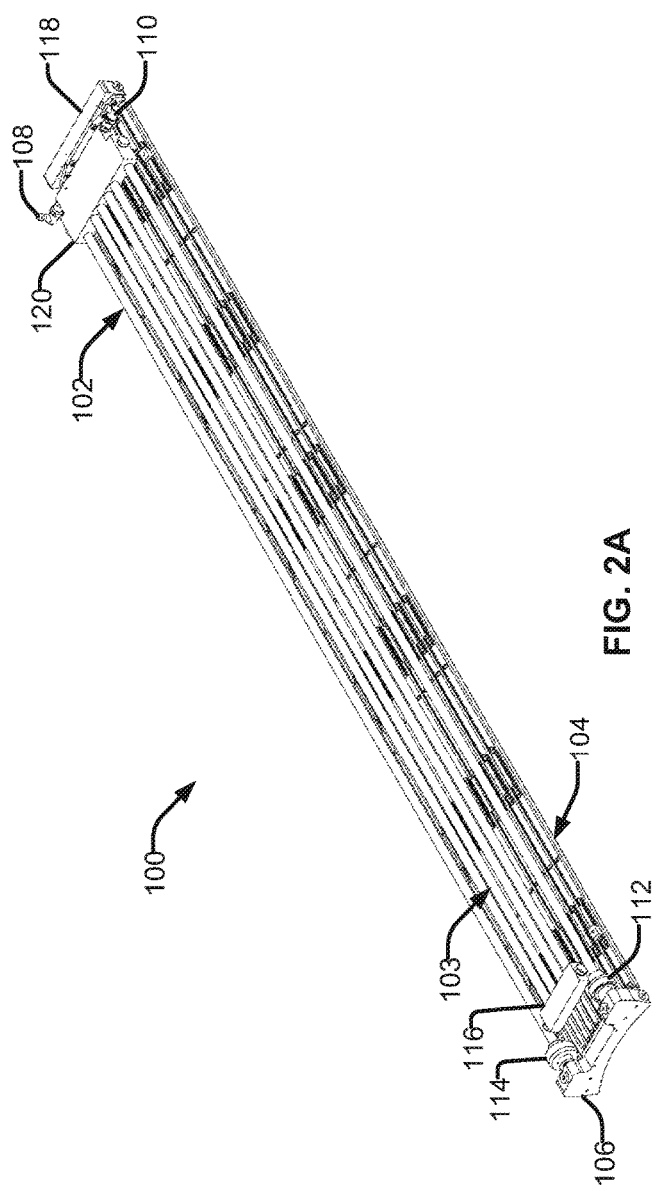
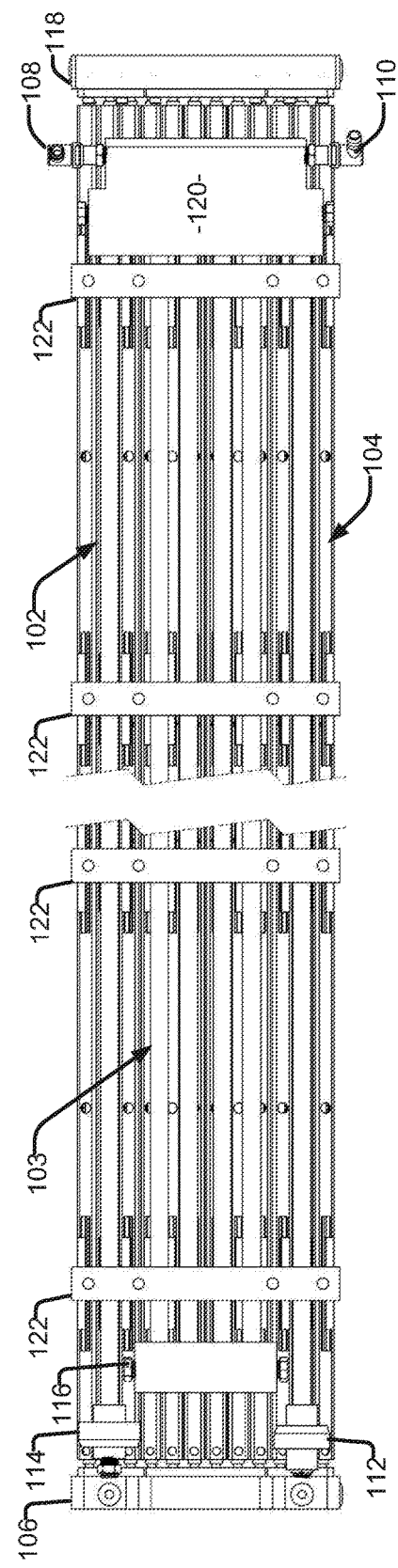
FIG. 2A
FIG. 2B

US 11,871,537 B2

COOLING SYSTEM FOR A MATERIAL SURFACE TREATMENT SYSTEM

BACKGROUND

Some material surface treatment systems utilize high voltage electrodes to treat the surface of articles such as foils or films by electric discharge. The use of high voltages on the discharge electrode results in very high discharge tube temperatures.

Conventionally, the discharge tube was cooled by passing large volumes of air across the tube at high speeds. Such cooling systems had inherent problems in that they introduced airborne particles and dust into the system and typically generated excessive noise.

Accordingly, there is a need for an efficient and clean system and method for material surface treatment.

SUMMARY

Disclosed are systems and methods to provide electrode cooling for material surface treatment systems. In particular, systems and methods employ a cooling fluid to cool electrodes with a high voltage applied is provided. For example, a conduit conveys a cooling fluid through the electrode, as the conduit also provides electrification for the electrode by being connected to an electrical power source. Further, cooling fluid is implemented by use of a voltage isolator disposed between the conduit and a reservoir, with the voltage isolator to provide a pathway to a reference voltage for residual electric charge from the cooling fluid passing through the voltage isolator.

These and other features and advantages of the present invention will be apparent from the following detailed description, in conjunction with the appended claims.

BRIEF DESCRIPTION OF THE DRAWINGS

The benefits and advantages of the present invention will become more readily apparent to those of ordinary skill in the relevant art after reviewing the following detailed description and accompanying drawings, wherein:

FIG. 2A is a perspective view of an example material surface treatment system including an electrode cooling system, in accordance with aspects of this disclosure.

FIG. 2B is a detailed view of the example material surface treatment system including an electrode cooling system of FIG. 2A.

The figures are not necessarily to scale. Where appropriate, similar or identical reference numbers are used to refer to similar or identical components.

DETAILED DESCRIPTION

Figure 1A:
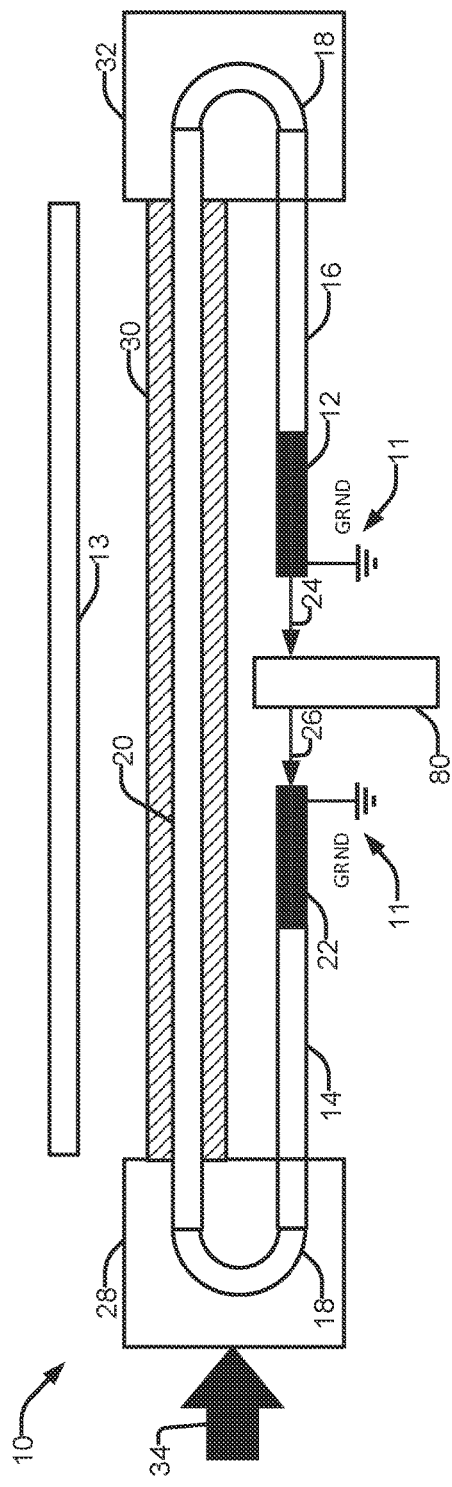
FIG. 1A is an example schematic diagram of a material surface treatment system including an electrode cooling system, in accordance with aspects of this disclosure.

The present disclosure describes a cooling system that employs a cooling fluid to cool electrodes with a high voltage applied. For example, a conduit conveys a cooling fluid through the electrode, as the conduit also provides electrification for the electrode by being connected to an electrical power source. Further, cooling fluid is implemented by use of a voltage isolator disposed between the conduit and a reservoir, with the voltage isolator to provide a pathway to a reference voltage for residual electric charge from the cooling fluid passing through the voltage isolator. The voltage isolator provides distance between the source of electrification and the reservoir to lessen the amount of charge to be discharged as the cooling fluid exits the voltage isolator.

Many materials (e.g., plastics, such as polyethylene and polypropylene), have surfaces with low surface tensions that inhibits bonding with surface treatments, such as printing inks, coatings, and/or adhesives. Material surface treatment systems are employed to alter the characteristics of a particular material (e.g., plastic and/or flexible substrates) and applications (e.g., inks, coatings, adhesives and/or laminations). For example, a plastic film generally needs some type of surface treatment to achieve suitable chemical bonding with an ink, adhesive, etc. This is contrasted with a porous material like paper, where ink is able to penetrate into the medium.

A variety of materials can be effectively treated using such systems and methods (e.g., polyethylene, polypropylene, nylon, vinyl, PVC, PET, metalized surfaces, foils, paper, and paperboard stocks).

Various techniques have been implemented to provide a desired material characteristic for such materials. For example, a corona treatment is a surface treatment that employs a relatively low temperature electrical corona discharge to change a characteristic of the material. Corona treatment, which employs one or more electrodes, provides desirable adhesion characteristics at a reasonable cost. A corona electrode generates a high voltage and is effective to modify a surface energy of a working material (e.g., plastics, paper, foils, etc.).

Another example is a plasma treatment, where gases are injected into the electrode discharge to treat the material surface. For example, some materials are more receptive to plasma treatments versus a corona treatment in order to achieve a desired bonding characteristic.

By comparison to corona treatments, plasma treatments are often associated with higher cost and complexity, such as use of delicate electrodes and greater energy inputs. Thus, greater implementation of plasma treatments has been limited in the industry. However, some materials respond more favorably to plasma treatments rather than corona treatments (e.g., fluoropolymers, polypropylenes, etc.).

In both corona and plasma treatment systems, which employ corona electrodes and plasma electrodes, respectively, systems and methods to effectively and efficiently provide cooling to the electrodes will provide the benefits of higher power outputs (e.g., via the capability to control electrode temperature) and improved surface treatment. Additionally or alternatively, the disclosed cooling system facilitates maintenance efforts, and is configured to operate with water, providing an inexpensive and relatively trouble-free cooling fluid.

Thus, as disclosed herein, a material surface treatment system includes an electrode cooling system. In examples, the electrode cooling system provides for a cooling fluid to be circulated through one or more electrodes. In particular, the cooling fluid is conveyed through one or more conduits, each disposed within a respective electrode, the cooling fluid drawing heat from the electrode as it is conveyed through the conduits.

Due to the conductive properties of the cooling fluid (e.g., water), the fluid is also electrified as it passes through the conduit(s), which receive input voltage from an electrical power source (e.g., a mains power source). In some examples, the conduits are conductive and connected to a conductive manifold, which serves to connect and distribute power to the one or more conduits to provide electrical energy for the electrodes.

While passing through the conductive conduits, the cooling fluid becomes electrified. To remove excess charge, the cooling fluid is transferred from the conduits to a voltage isolator system. For example, the voltage isolator system provides a pathway to a reference voltage (e.g., ground) such that residual electric charge from the cooling fluid is removed upon outflow from and inflow to the voltage isolator.

In disclosed examples, the voltage isolator system includes one or more nonconductive tubes disposed between the conduit and a reservoir, the voltage isolator to provide distance from the source of electrification (e.g., the conduits, manifold, connectors, etc.) and the reference voltage (e.g., a pathway to ground). Thus, as the cooling fluid flows from the conductive, electrified conduits into the nonconductive tubes, the charge dissipates to a level suitable for removal prior to being returned to the reservoir.

In examples, the voltage isolator system is adjacent to but electrically isolated from the electrodes of the material treatment system. For instance, multiple electrodes may be arranged in a parallel configuration to form a magazine, such that a web of material passing over the magazine is subjected to electrification from multiple electrodes. The voltage isolator system is arranged in proximity to the electrodes, to provide a compact envelope in which the material treatment system is contained.

In order to maintain a small footprint, the tubes of the voltage isolator system may be arranged in a manner to extend the distance between electrification and return to the reservoir. For example, two or more tubes may be arranged in parallel and connected on the ends to provide for a circuitous return pathway. Thus, the distance the heated and charged cooling fluid is conveyed prior to return to the reservoir is greater than a linear distance of the system footprint, thereby lessening the amount of charge to be discharged at the exit port. A similar technique (e.g., increased distance and/or pathway) can be provided for cooling fluid flowing from the reservoir into the electrode(s).

Advantageously, the voltage isolator system disclosed herein can be applied to a material surface treatment system that includes an arrangement of either corona electrodes or plasma electrodes. The cooling system provides a cooling fluid through a sealed conduit, such that the fluid is no longer making contact with ceramic tubes, which created issues of expansion and leaking. Further, this eliminates the requirement for enclosing the ceramic electrodes. Further, cooling efficiency is increased by the ability to alter flow pathways, to restrict or expand the length and/or number of electrodes through which the cooling fluid is conveyed before returning to the reservoir.

Advantageously, such systems and methods eliminate the dirt and noise problems typically associated with air cooling. Also, special atmospheres such as nitrogen can be contained within the material system without losses caused by exhaust air cooling. The disclosed system allows for easy maintenance, coupling and decoupling of the electrodes, conduits, and the voltage isolation system, including the tubing, ports and connectors. Thus, the internally, water-cooled ceramic plasma electrode design substitutes for internal air and/or oil cooled models that were less effective in keeping plasma electrodes at a desired operating temperature. Due to the enhanced cooling effect, the disclosed system supports a substantially higher electrical output level.

In disclosed examples, a cooling system for a material surface treatment system is provided. The cooling system includes a conduit to convey a cooling fluid through an electrode, the conduit being connected to an electrical power source, and a voltage isolator disposed between the conduit and a reservoir, the voltage isolator configured to provide a pathway to a reference voltage for residual electric charge from the cooling fluid passing through the voltage isolator.

In some examples, the voltage isolator comprises two or more tubes to convey the cooling fluid between the conduit and the reservoir, the cooling system further includes a first port for introducing the cooling fluid into the two or more tubes, and a second port for withdrawing the cooling fluid from the two or more tubes. In examples, the two or more tubes are non-conductive. In examples, one or more conductive contacts connecting the first or second ports to the reference voltage. In examples, one or more couplers to connect a tube of the two or more tubes to the conduit.

In some examples, the two or more tubes comprises a first tube and a second tube, the first tube connected to the first port and the second tube being connected to the second port, wherein the cooling fluid flows into the first tube in a first direction via the first port and flows out of the second tube in a second direction via the second port. In examples, the first port is disposed in a first end of the conduit and the second port is disposed in a second end of the conduit, the cooling fluid to be conveyed through the length of the electrode. In examples, the conduit comprises a plurality of conduits, each conduit being connected to another conduit at one or more ends, wherein each conduit spans the length of a respective electrode.

In some examples, the first port is disposed in a first end of a first tube of the plurality of tubes and the second port is disposed in a second end of a second tube such that the cooling fluid is conveyed through both the first and second tubes. In examples, a reservoir connected to the conductive manifold via the voltage isolator, and a pump operatively connected to the reservoir for circulating the cooling fluid through the cooling system. In examples, the voltage isolator includes a conductive contact operatively connected to the first or second port to remove any residual charge from the heated and charged cooling fluid as it flows past the conductive contact, wherein the conductive contact electrically connected to a reference voltage.

In some examples, the conduit is connected to a conductive manifold via a first connector. In examples, the cooling fluid flows through the conduit from the first connector at a first end of the conduit to a second connector at a second end of the conduit, the second connector being connected to a second conduit to convey the cooling fluid back to the conductive manifold, such that a single conductive manifold provides inflow and outflow of the cooling fluid through the electrode. In examples, the cooling fluid flows through the conduit from the first connector at a first end of the conduit to a second connector at a second end of the conduit, wherein the second connector is connected to a second manifold such that the conductive manifold provides inflow and the second manifold provide outflow of the cooling fluid through the electrode.

In some examples, the electrode comprises one of a plasma electrode comprising a non-conductive ceramic material or a corona electrode. In examples, the cooling fluid is water. In examples, the cooling system is operatively coupled to an electrode assembly comprising a plurality of electrodes.

In disclosed examples, a material surface treatment system is provided which includes an electrode to generate an electric discharge to treat a material near the electrode and a cooling system. The cooling system includes a conduit to convey a cooling fluid through the electrode and a voltage isolator disposed between the conduit and a reservoir, the voltage isolator configured to provide a pathway to a reference voltage for residual electric charge from the cooling fluid passing through the voltage isolator.

In some examples, a grounding roll configured to engage with a web of material, the material to be subjected to plasma discharged from the electrode to alter a property of the material for additional processing. In some examples, the conduit is connected to an electrical power source via a conductive manifold to provide current through the conduit to activate the electrode.

FIG. 1A illustrates a material treatment system 10 that includes a discharge electrode 30 in electrical communication with power input 34, connected through a conductive manifold 28. In some examples, a material roller 13 (e.g., a grounded bare roll) is arranged to allow a web of material (e.g., paper or plastic film) to pass over the electrode 30, to be treated by the electrode 30 discharge. The power system providing power input 34 may include a high voltage transformer and/or a power supply (e.g., mains power). In some examples, the discharge electrode 30 is charged to approximately 10 to 15 kilovolts, however other ranges are also contemplated.

The discharge electrode 30 consists of a dielectric tube (e.g., ceramic), with a conductive cooling fluid (such as water) flowing within the conduit 20 in order to distribute a high voltage charge uniformly along the length of the electrode 30.

In order to remove residual charge from cooling fluid cycling through the system, the conduit 20 receives the cooling fluid from a voltage isolation system. The voltage isolation system provides distance between the charged conduit (and other charged components), such that the charge on the cooling fluid is lessened such that charge is readily removed through a reference voltage (e.g., to ground). As shown in FIG. 1A, the voltage isolation system provides nonconductive tubes 14 and 16 at both the input and output of the conduit 20, thereby providing distance and electrical isolation between the charged electrode 30 and the fluid reservoir 80. Both the first (input) tube 14 and the second (output) tube 16 provide access to a connector 11 which offers a pathway to a reference voltage (e.g., to ground) for any residual charge on the cooling fluid.

Accordingly, cooling fluid is provided to the conduit 20 through a tube 14 and an input port 22 via a connector 18 at a first end of the conduit, and is discharged from the conduit 20 via another connector 18 at the other end (housed within a manifold 32). For example, connector(s) 18 may connect the conduit 20 with the manifold 28 (e.g., for electrification). By use of a manifold 28, 32 and associated connector(s) 18, the conduit 20 can be isolated from the manifold 28, 32 for maintenance and/or reconfiguration (e.g., for multi-electrode arrangements, such as those illustrated in FIGS. 1B to 6). The manifold 28, 32 generally includes a housing formed of an electrically conductive material such as stainless steel.

The electrified manifold 28, 32 provides high voltage energy to conductive conduit 20 (e.g., made of a metal, such as stainless steel) which is connected to connector/fitting 18. In some examples, manifold 28, 32 serves as a housing for power input and distribution for the conduit 20, but is not itself conductive.

Each port is formed from a dielectric material such as a plastic. The input port 22, input and output tubes 14 and 16, and/or output port 12 are sealed at connections by one or more seals (e.g., an O-ring), which can be seated in a groove in each connector or port. In order to provide a fluid-tight seal, one or more fastening techniques may be employed (e.g., welding, sealing, application of an epoxy resin) at the surface of each connector or port to form a secure connection with the ends of the conduit 20 and/or tube(s) 14, 16.

In operation, cooling fluid is pumped from the reservoir 80 by pump. Cooling fluid passes through first port 22, through tube 14 and into the conduit 20, through connector 18. In the example of FIG. 1A, at the opposite end of conduit 20, another connector 18 provides the cooling fluid from the conduit 20 and into a second tube 16. As the cooling fluid passes through tube 16, excess charge is discharged from the heated and charged fluid at a grounded contact 11 at second port 12 prior to discharge of the cooling fluid 24 into the reservoir 80.

The heat generated by the discharge between electrode 30 and ground roll is transmitted through the wall of conduit 20 and is carried away by the cooling fluid. The cooling fluid is therefore at an elevated temperature and electrically conductive as it is conveyed through the manifold 28 and into the non-conductive tube 14, which forms part of a high voltage isolator system. As the heated and conductive fluid is conveyed a distance from an electrified component (e.g., the conduit 20 and/or the manifold 28), the cooling fluid is conveyed to fluid return port 12, which includes the conductive contact 11 connected to a reference voltage (e.g., with a pathway to ground or other electrical return).

The heated and charged cooling fluid leaves the electrode 30 and travels back through second tube 16 and return port 12 to the reservoir 80. The cooling fluid passing through conduit 20 and returning to the reservoir 80 via second tube 16 is at a high voltage potential due to electrical energy being conducted through the cooling fluid from the conduit 20. As the fluid travels through second tube 16 of the high voltage isolator system, the electrical energy of the cooling fluid dissipates to a level suitable for discharge at the second port 12 via conductive contact 11 connected to a reference voltage (e.g., via a ground cable). The cooling fluid flows from second port 12 to the reservoir 80, as illustrated by arrow 24, at a low voltage potential, where the fluid is cooled and recirculated.

In order to provide a replenished source of cooling fluid, the cooling system includes a pump (e.g., driven by a motor) connected to reservoir 80. In examples, cooling fluid is drawn from and returned to the fluid reservoir 80, which may be connected with one or more of a heat pump, a heat sink, a radiator, and/or another type of cooling technology. A cooling fluid such as water is pumped from the reservoir 80 through line 26 to the conduit 20 of electrode 30 and returned through tube 14 and line 24 to the reservoir 80. In some examples, one or more tubes are incorporated to extend the length of nonconductive tubing, which may further increase the distance between the conductive elements (e.g., the conduit 20, the manifold 28, one or more connectors, etc.) and the grounded contacts at ports 12 and 22.

For example, one or more lengths of plastic tubing can connect the ports 12 and 22 to the reservoir 80, with each tube having a length sufficient to lessen the charge at the ports. As the heated and conductive fluid makes contact with a grounded contact (e.g., a conduit, conductive plate, conductor, etc.), high voltage potential is effectively dissipated, preventing excess charge being introduced into the cooling reservoir 80.

Figure 1B:
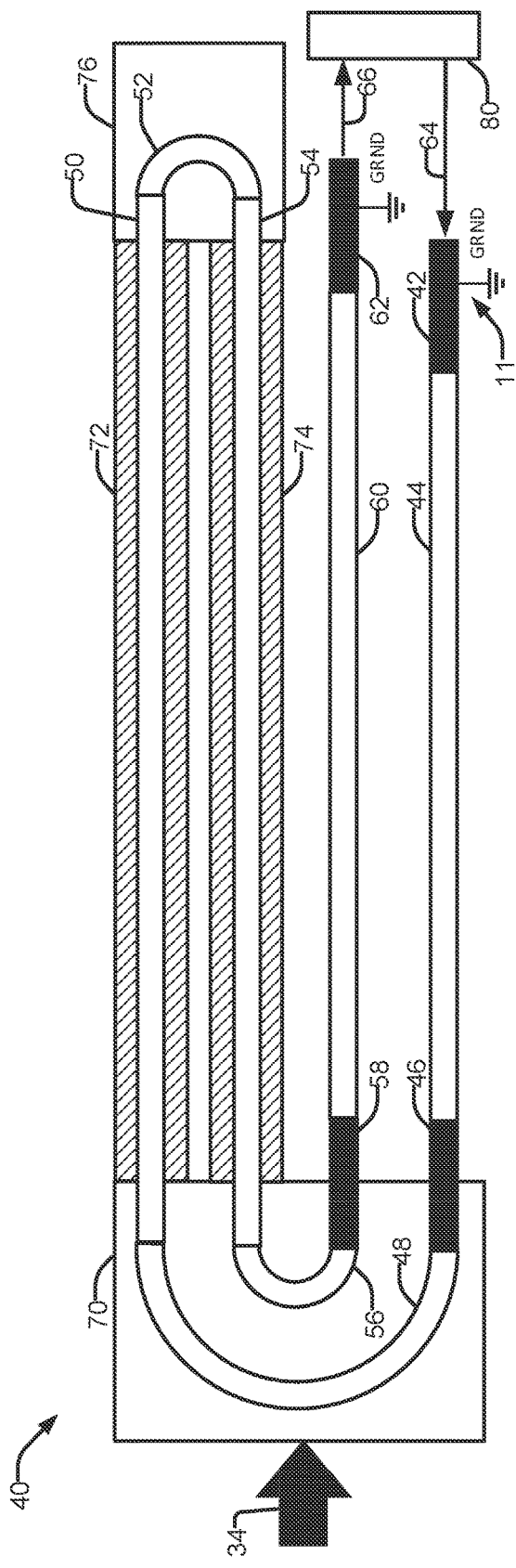
FIG. 1B is another example schematic diagram of a material surface treatment system including an electrode cooling system, in accordance with aspects of this disclosure.

FIG. 1B is another example schematic diagram of a material surface treatment system including an electrode cooling system, in accordance with aspects of this disclosure. As shown in FIG. 1B, the cooling fluid from the reservoir 80 enters nonconductive tube 44 via first port 42, illustrated by arrow 64, and is conveyed through the electrode system to reverse flow direction and flow back through tube 60 to return through port 62. The cooling fluid is heated as it flows through conduits 54 and 50, which are electrified via manifold 70. Due to its slight electrical conductivity, the cooling fluid conducts the high voltage present through the conduits 50 and 54.

The cooling fluid is transferred between the nonconductive elements of the voltage isolator system and the conductive elements associated with the electrode(s) via the connectors 46 and 58, which may be conductive or nonconductive. In some examples, one or more elements associated with the electrodes may also be conductive, which may electrify the cooling fluid (e.g., manifold 70, connectors 48, 56, and 52; and/or housing 76). Ultimately, the cooling fluid returns through second port 62 to the reservoir 80, as illustrated by arrow 66.

In operation, cooling fluid is pumped from the reservoir 80 through tube 60 and into the conduit 54 (within electrode 74). The cooling fluid then redirected through connector 52 to be conveyed in the opposite direction via conduit 50, through connector 48 and/or 46, and through tube 44. As the heated and charged cooling fluid is output to the reservoir 80, it passes by a conductive contact 11 connected to a reference voltage to discharge excess charge.

Additionally, FIG. 1B illustrates a path through the cooling system that conveys the cooling fluid through the conduit 50, which becomes heated and charged, and then in reverse direction through conduit 54, where the cooling fluid becomes further heated and charged. However, in some examples, cooling fluid may flow into and out from only a single conduit, such that the heat and charge acquired by the cooling fluid does not accumulate. Thus, higher temperatures may be possible at each electrode, as the cooling effect is amplified by conveyance of cooler fluid at each conduit (rather than only the first conduit to receive cooling fluid).

This can be accomplished by modifying the connector(s) 48 and 54 within the manifold 70 to provide an input from tube 44. Further, manifold 76 can be modified to provide an output (e.g., via tube 60) to return heated and charged cooling fluid to the reservoir 80, as disclosed herein.

In view of the disclosed material surface treatment system of FIGS. 1A and 1B, FIGS. 2A through 6 provides a detailed example of a material surface treatment system, including an electrode cooling system that includes a high voltage isolation system, in accordance with aspects of this disclosure.

FIG. 2A provides a perspective views of an example material surface treatment system 100, which includes an electrode cooling system. For instance, a plurality of nonconductive tubes 102 are connected to a first port 108 and a second port 110 to draw cooling fluid from and return cooling fluid to a reservoir, as disclosed herein. The plurality of nonconductive tubes 102 are supported by one or more supports or braces 122. In the example of FIG. 2A, first port 108 and second port 110 connect with external tubes 102 and/or internal tubes 103 via a manifold 120, although other connectors are contemplated. A second manifold 116 is arranged at an end of one or more tubes 103 to provide a pathway for cooling fluid to extend the distance between the first port 108 and/or the second port 110 and electrifying manifold 106. Thus, cooling fluid is to enter the system 100 at manifold 120 via first port 108, enter a network of tubes 102/103, which may reverse course at manifold 116 and/or 120 to provide an extended pathway that spans several lengths of the system, before entering the manifold 106 via connector 114.

The cooling fluid is conveyed from the manifold 106 into conduits within respective electrodes 104, where the cooling fluid becomes heated and charged. The cooling fluid is then conveyed from the manifold 106 back through the network of tubes 102/103, returning to manifold 120 in a reverse pathway. The cooling fluid then returns to second port 110, to be conveyed via one or more nonconductive tubes to a reservoir. As disclosed herein, one or more grounding contacts can be incorporated in the first and/or second ports, to ensure that charge carried by the cooling fluid is discharged prior to returning to the reservoir. FIG. 2B provides a view of the system 100 with features of the electrode cooling system prominently displayed.

Figure 3A:
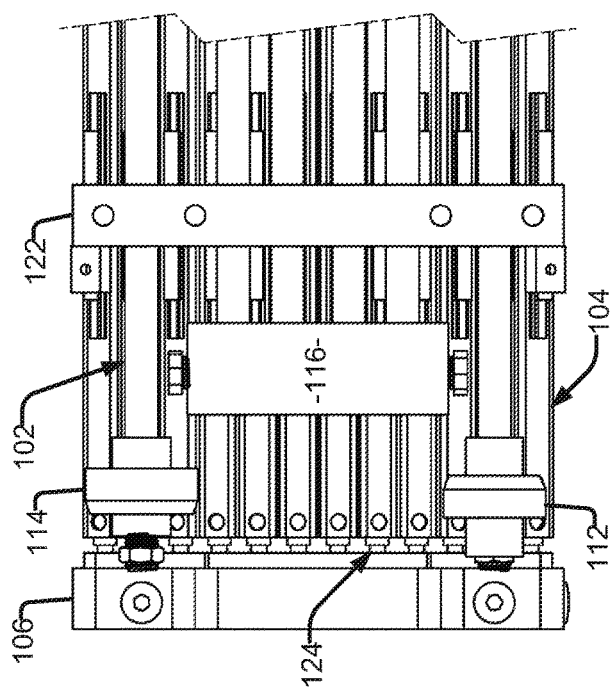
FIG. 3A is a detailed view of the example material surface treatment system including an electrode cooling system of FIGS. 2A and 2B.
Figure 3B:
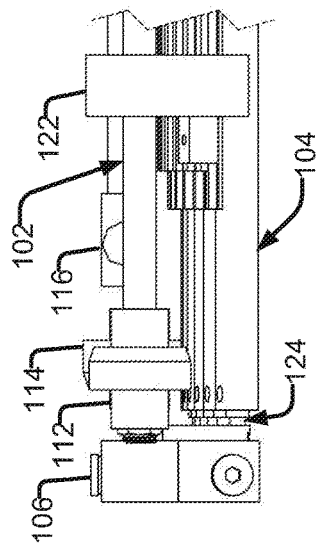
FIG. 3B is a side view of the detailed view of the example material surface treatment system of FIG. 3A.

FIG. 3A is a detailed view of the example material surface treatment system including an electrode cooling system shown in FIGS. 2A and 2B. FIG. 3B is a side view of the detailed view of the example material surface treatment system of FIG. 3A. In particular, conduits 124 (similar to conduits 20 and 50, 54 of FIGS. 1A and 1B, respectively), are illustrated connected to manifold 106 and extending into electrodes 104.

Figure 4A:
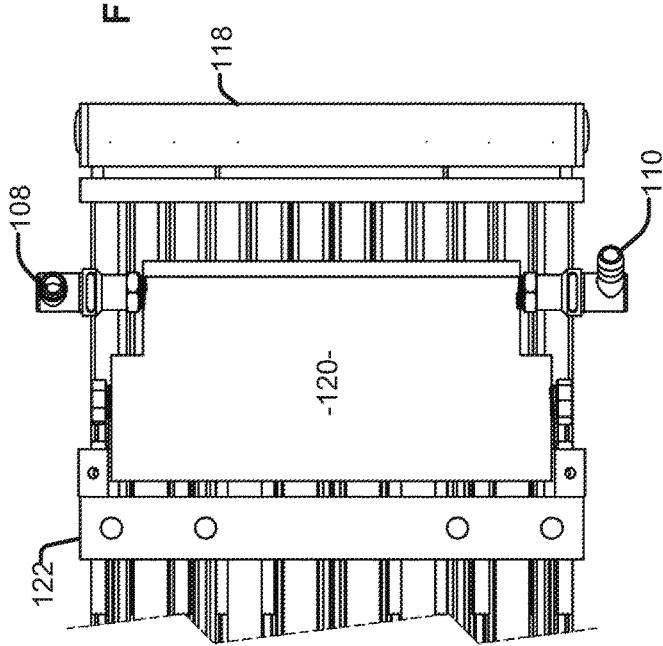
FIG. 4A is another detailed view of the example material surface treatment system including an electrode cooling system of FIGS. 2A and 2B.
Figure 4B:
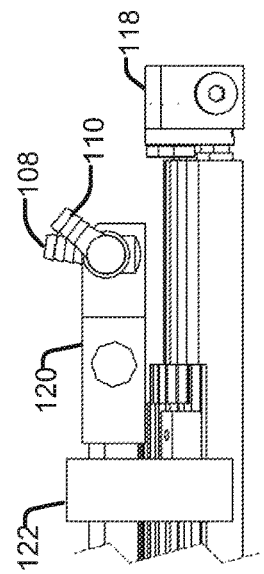
FIG. 4B is a side view of the detailed view of the example material surface treatment system of FIG. 4A.

FIG. 4A is another detailed view of the example material surface treatment system including an electrode cooling system of FIGS. 2A and 2B, whereas FIG. 4B is a side view of the detailed view of the example material surface treatment system of FIG. 4A.

Figure 5A:
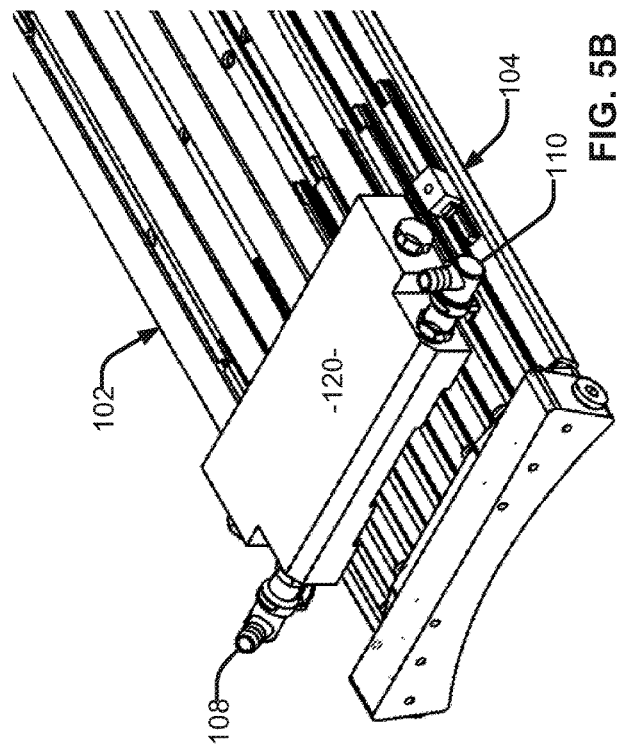
FIG. 5A is a perspective view of the detailed view of the example material surface treatment system of FIG. 3A.
Figure 5B:
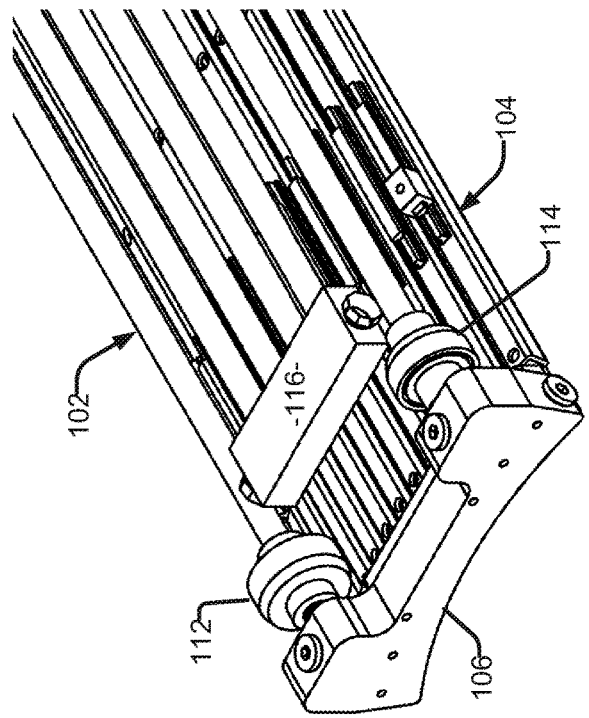
FIG. 5B is a side view of the detailed view of the example material surface treatment system of FIG. 4A.

FIG. 5A is a perspective view of the detailed view of the example material surface treatment system of FIG. 3A, whereas FIG. 5B is a side view of the detailed view of the example material surface treatment system of FIG. 4A.

Figure 6:
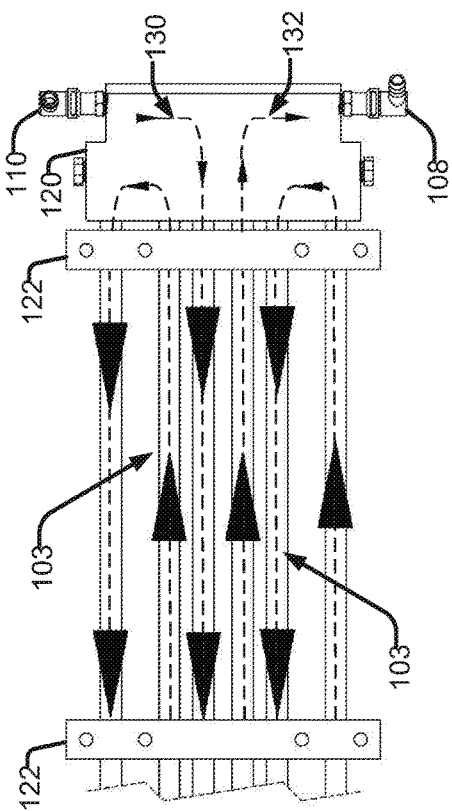
FIG. 6 is an example schematic diagram of a voltage isolator of an electrode cooling system, in accordance with aspects of this disclosure.
Figure 6:
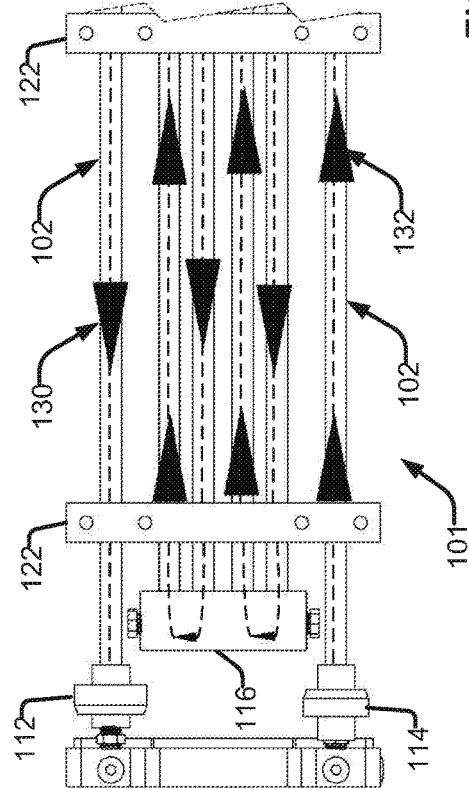

FIG. 6 is an example schematic diagram of flow patterns through a voltage isolator 101 of an electrode cooling system. For example, the voltage isolator 101 includes one or more nonconductive tubes 102/103 disposed between the manifold 106 and a reservoir. Thus, the voltage isolator provides distance from the source of electrification (e.g., the conduits, manifold, connectors, etc.) and the reference voltage (e.g., a pathway to ground), such that the charge dissipates to a level suitable for removal prior to being returned to the reservoir. As disclosed herein, the voltage isolator 101 can be located in proximity to the electrodes, but configured to be electrically isolated.

Triangles are used to represent an example flow pattern of the cooling fluid. As shown in the example of FIG. 6, cooling fluid is input at port 110 (e.g., from a reservoir via one or more tubes) in accordance with pathway 130. The pathway 130 traverses one or more internal tubes 103 the length of the voltage isolator 101 to manifold 116. The pathway 130 returns through manifold 120, is again redirected through tube 102 to reach manifold 106 via connector 112. The cooling fluid is then conveyed through the plurality of electrodes 104, as disclosed herein.

The heated and charged cooling fluid is then output from the manifold 106 via connector 114 through tube 102. In a reverse manner, the cooling fluid follows a pathway 132, through manifold 120 where the pathway 132 is redirected toward manifold 116 via one or more internal tubes 103. Ultimately, the cooling fluid is discharged via port 108, where the heated and charged fluid releases any excess charge prior to return to the reservoir.

The present invention provides a means of cooling the electrode without using high velocity exhaust air. The high voltage isolator permits cooling of the electrode with a cooling fluid without the possibility of high voltage being conducted back to the reservoir and/or pumping mechanism. As such, an efficient, clean and quiet surface treatment system can operate with controlled atmospheres is provided.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, systems, blocks, and/or other components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. A cooling system for a material surface treatment system, the cooling system comprising:
   a plurality of conduits to convey a cooling fluid through an electrode, each conduit being connected to another conduit at one or more ends, wherein each conduit spans the length of a respective electrode, and a conduit of the plurality of conduits is connected to an electrical power source;
   a voltage isolator disposed between the conduit and a reservoir, the voltage isolator configured to provide a pathway to a reference voltage for residual electric charge from the cooling fluid passing through the voltage isolator, wherein the voltage isolator comprises two or more tubes to convey the cooling fluid between the plurality of conduits and the reservoir;
   a first port for introducing the cooling fluid into the two or more tubes; and
   a second port for withdrawing the cooling fluid from the two or more tubes, wherein the first port is disposed in a first end of the plurality of conduits and the second port is disposed in a second end of the plurality of conduits, the cooling fluid to be conveyed through the length of the electrode.

2. The cooling system of claim 1, wherein the two or more tubes are not electrically conductive.

3. The cooling system of claim 1, further comprising one or more conductive contacts connecting the first or second ports to the reference voltage.

4. The cooling system of claim 1, further comprising one or more couplers to connect a tube of the two or more tubes to the conduit.

5. The cooling system of claim 1, wherein the two or more tubes comprises a first tube and a second tube, the first tube connected to the first port and the second tube being connected to the second port, wherein the cooling fluid flows into the first tube in a first direction via the first port and flows out of the second tube in a second direction via the second port.

6. The cooling system of claim 1, wherein the first port is disposed in a first end of a first tube of the plurality of tubes and the second port is disposed in a second end of a second tube such that the cooling fluid is conveyed through both the first and second tubes.

7. The cooling system of claim 1, wherein the reservoir is connected to an electrically conductive manifold via the voltage isolator; and the system further comprising a pump operatively connected to the reservoir for circulating the cooling fluid through the cooling system.

8. The cooling system of claim 7, wherein the voltage isolator comprises a conductive contact operatively connected to the first or second port to remove any residual charge from the heated and charged cooling fluid as it flows past the conductive contact, wherein the conductive contact electrically connected to a reference voltage.

9. The cooling system of claim 1, wherein the conduit is connected to an electrically conductive manifold via a first connector.

10. A cooling system for a material surface treatment system, the cooling system comprising:
    a conduit to convey a cooling fluid through an electrode, the conduit being connected to an electrical power source;
    a voltage isolator disposed between the conduit and a reservoir, the voltage isolator configured to provide a pathway to a reference voltage for residual electric charge from the cooling fluid passing through the voltage isolator; and
    an electrically conductive manifold, wherein the cooling fluid flows through the conduit from a first connector at a first end of the conduit to a second connector at a second end of the conduit, the second connector being connected to a second conduit to convey the cooling fluid back to the electrically conductive manifold, such that a single electrically conductive manifold provides inflow and outflow of the cooling fluid through the electrode.

11. The cooling system of claim 10, wherein the cooling fluid flows through the conduit from the first connector at a first end of the conduit to a second connector at a second end of the conduit, wherein the second connector is connected to a second manifold such that the electrically conductive manifold provides inflow and the second manifold provide outflow of the cooling fluid through the electrode.

12. The cooling system of claim 1, wherein the electrode comprises one of a plasma electrode comprising a non-conductive ceramic material or a corona electrode.

13. The cooling system of claim 1, wherein the cooling fluid is water.

14. The cooling system of claim 1, wherein the cooling system is operatively coupled to an electrode assembly comprising a plurality of electrodes.

15. A material surface treatment system comprising:
an electrode to generate an electric discharge to treat a material; and
a cooling system comprising:
a conduit to convey a cooling fluid through the electrode; and
a voltage isolator disposed between the conduit and a reservoir, the voltage isolator configured to provide a pathway to a reference voltage for residual electric charge from the cooling fluid passing through the voltage isolator; and
an electrically conductive manifold, wherein the cooling fluid flows through the conduit from a first connector at a first end of the conduit to a second connector at a second end of the conduit, the second connector being connected to a second conduit to convey the cooling fluid back to the electrically conductive manifold, such that a single electrically conductive manifold provides inflow and outflow of the cooling fluid through the electrode.

16. The material surface treatment system of claim 15, further comprises a grounding roll configured to engage with a web of material, the material to be subjected to plasma discharged from the electrode to alter a property of the material for additional processing.

17. The material surface treatment system of claim 15, wherein the conduit is connected to an electrical power source via an electrically conductive manifold to provide current through the conduit to activate the electrode.

18. The material surface treatment system of claim 15, wherein the conduit comprises a plurality of conduits, each conduit being connected to another conduit at one or more ends, wherein each conduit spans the length of the electrode.

* * * * *